United States Patent [19]

Rajeevakumar

[11] 4,361,768
[45] Nov. 30, 1982

[54] SUPERCONDUCTING SOLITON DEVICES

[75] Inventor: Thekkemadathil V. Rajeevakumar, Croton-on-Hudson, N.Y.

[73] Assignee: International Business Machines Corporation, Armonk, N.Y.

[21] Appl. No.: 191,602

[22] Filed: Sep. 29, 1980

[51] Int. Cl.³ .................... H03K 17/92; H03K 19/195
[52] U.S. Cl. .................................. 307/245; 307/306; 307/463; 307/476; 357/5
[58] Field of Search ............... 307/245, 277, 306, 462, 307/476, 244, 463; 365/162; 357/5

[56] References Cited

U.S. PATENT DOCUMENTS 3,936,677 2/1976 Fulton et al. ...................... 307/306

OTHER PUBLICATIONS

K. Nakajima et al., "Logic Design of Josephson Network", Journal of Applied Physics, vol. 47, No. 4, Apr. 1976, pp. 1620–1627.
T. A. Fulton et al., "Experimental Flux Shuttle", Appl. Phys. Lett., vol. 22, No. 5, Mar. 1, 1972, pp. 232–233.
T. A. Fulton et al., "The Flux Shuttle–A Josephson Junction Shift Register Employing Single Flux Quanta", Proc. of IEEE 61, pp. 28–35, 1973.
J. Rubinstein, "Sine–Gordon Equation", Journal of Mathematical Physics, vol. 11, No. 1, Jan. 1970, pp. 258–266.
A. C. Scott, "Propagation of Magnetic Flux on a Long Josephson Tunnel Junction", Il Nuovo Cimento, vol. 69B, No. 2, 1970, pp. 241–260.
T. A. Fulton et al., "Single Vortex Propagation in Josephson Tunnel Junctions", Solid State Communications, vol. 12, pp. 57–61, 1973.
T. V. Rajeevakumar et al., "Observation of Nonresonant Vortex Motion in a Long Josephson Tunnel Junction", Physical Review B, vol. 21, No. 1, pp. 5432–5437, Jun. 1, 1980.

Primary Examiner—John Zazworsky
Attorney, Agent, or Firm—Jackson E. Stanland

[57] ABSTRACT

Josephson solitons are steered along selected paths in response to applied control signals, the output path chosen being dependent solely upon the presence and absence of these control signals. An input Josephson transmission line is provided along which the Josephson soliton travels. This input line intersects with two output Josephson transmission lines. Bias currents of opposite polarity in the output transmission lines are used to steer the soliton into a selected one of the output lines. At the intersection of the input line and the output lines an isolating resistor is located. This resistor dissipates the anti-soliton created at the intersection and provides isolation between the input and the output of the device. In a preferred embodiment, one electrode of the input and output Josephson transmission lines can be comprised of a common superconductor and the isolating resistor can be located between the other electrodes of the output transmission line. Path selection is determined solely by the control signal, and is not dependent upon internal damping of the device or the choice of boundary conditions at the intersections.

15 Claims, 16 Drawing Figures

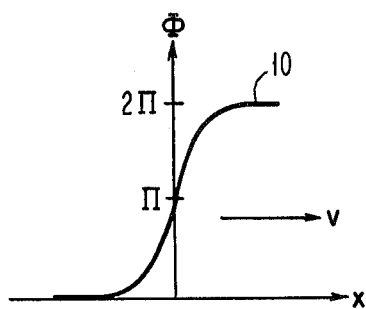
FIG. 1.1
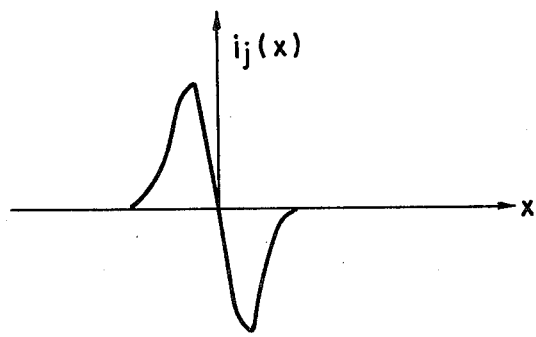
FIG. 1.2
FIG. 1.3
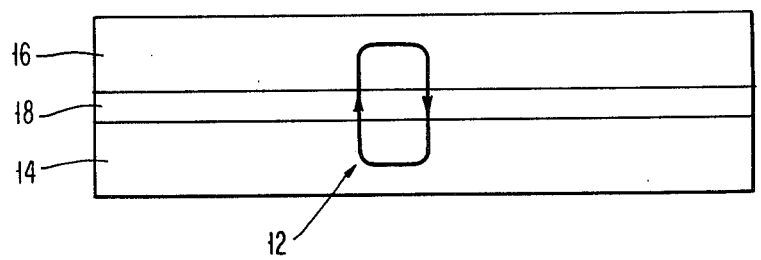

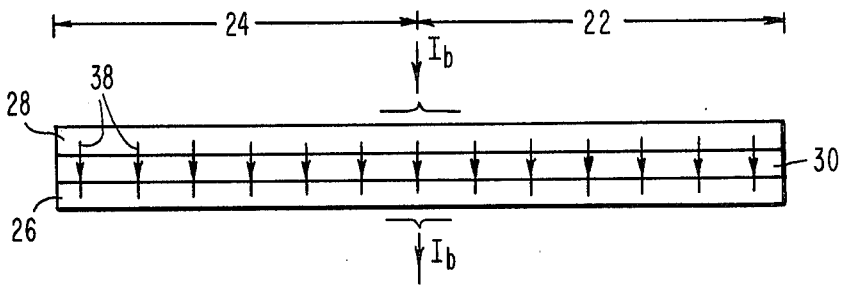
FIG. 3.1
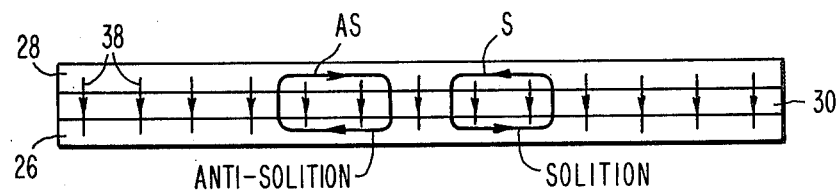
FIG. 3.2
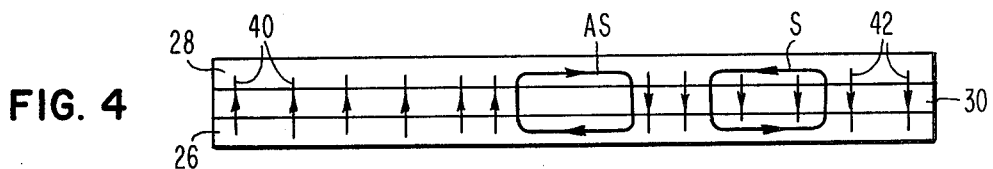
FIG. 4
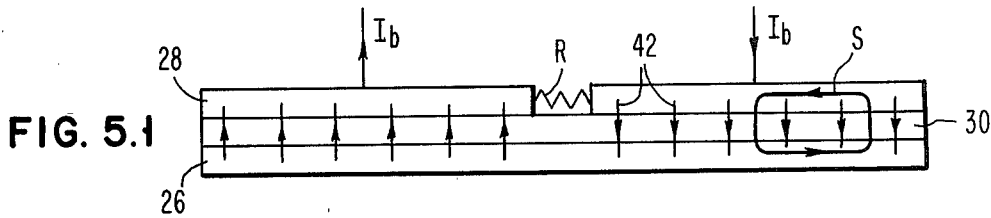
FIG. 5.1
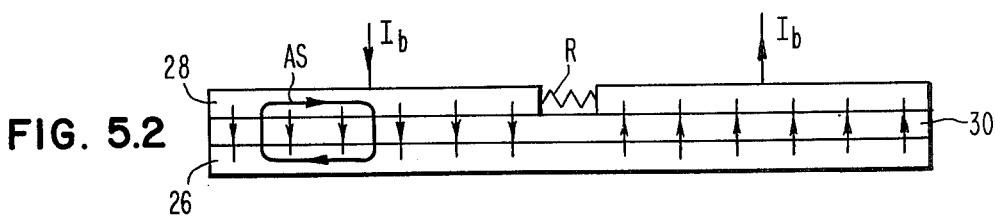
FIG. 5.2

SUPERCONDUCTING SOLITON DEVICES

DESCRIPTION

TECHNICAL FIELD

This invention relates to superconducting soliton devices, and more particularly to an improved technique for guiding solitons along selected paths in response to applied control signals.

BACKGROUND ART

Josephson devices are known in the art and have primary advantage in that they display low power dissipation (about 1 microwatt) and fast switching speeds (approximately tens of picoseconds). These are attributes for use as elements in super fast computers and they have been suggested for this application. The progress in the superconductive technology, and in particular the development of Josephson devices for memory and logic, has been quite substantial in the past decade.

Even prior to the discovery of the Josephson effect, it was pointed out that certain basic problems in large scale integration and in extreme miniaturization of electronic circuits may require new types of device structures. For example, although device dimensions decrease with decreasing line width, the number of connections per device remain more or less the same. Distributed device structures that avoid attenuation and dispersion of signals, and novel system concepts have been suggested in the art as alternatives. Further, the concept of distributed devices can easily be extended to the Josephson technology; however, only limited progress has been made so far as is apparent from K. Nakajima et al, J. Appl. Phys. 47, 1620 (1976); T. A. Fulton et al, Appl. Phys. Lett. 22, 232 (1973); and T. A. Fulton et al, Proc. IEEE 61, 28 (1973).

The present invention describes a distributed Josephson logical device based on the principle of selective control of the movement of Josephson solitons. These are isolated fluxoids, of a type known in the art and described more completely in J. Rubenstein, J. of Math. Phys. 11, 258 (1970); A. C. Scott, Nuovo Cimento B69, 241 (1970); and T. A. Fulton et al, Solid State Comm. 12, 57 (1973); and T. V. Rajeevakumar et al, Phys. Rev. B27, 5432 (1980). It is known in the art that a Josephson transmission line (i.e., a long one dimensional Josephson junction) can support the propagation of Josephson solitons as reported by the aforementioned T. V. Rajeevakumar reference. The soliton can be generated in the Josephson transmission line by known techniques and can be made to propagate and accelerate through the Josephson transmission line under the influence of the Lorentz force due to a bias current in the Josephson line.

The concept of using a soliton, or fluxoid, to carry information is known in the art, as is the concept of moving these information-representing solitons along the Josephson transmission line. Further, it is known that a soliton brought to the intersection of Josephson transmission lines can be made to follow one or another path away from the intersection. This is described in the Nakajima reference described previously, where that concept is used for the design of logic networks. In that paper, the authors describe "turning points" of two types: in one type a single flux quantum propagating to the trigger turning point (TTP) on any one line will initiate a single flux quantum on all connected lines, and in the other type, a second turning point named the selective turning point (STP), a single flux quantum propagating toward the point on any one line will initiate a single flux quantum on only one connected line. The determination of which line a single flux quantum propagates in depends upon the bias current of each line, the local applied magnetic field, and the junction geometry. Basic logic circuits using these turning points are described in this reference.

The structure of Nakajima et al has many disadvantages and is not a practical circuit. For example, the mechanism for selection of the path to be followed by the single flux quantum depends upon a very delicate balance in the competition between the device internal damping ($\Gamma$), which in turn is highly dependent upon the choice of device materials, the bias levels ($\gamma$) of the control signals, and the choice of boundary conditions at the intersections of the turning points. Because there are these competing forces, selection of a desired path for propagation of the soliton depends on factors other than just the presence or absence of the control signal. This means that the margins for path selection are very limited. Furthermore, any variations in device design across the chip or in the geometry of the various devices will lead to problems. Still further, the two types of turning points require different structure, and for this reason the logic chip will have to be fabricated from devices having different designs. This puts an additional constraint on the fabrication and on the number of masking steps which are required.

In the Nakajima et al circuits, undesired solitons will be generated at the turning points and these will not be easily removed. Also, effective isolation between the output of the devices and the input is not achieved when the control signals are directly coupled to the Josephson transmission lines. Additionally, in LSI circuits it is desirable to use the same control signal amplitudes throughout in order to improve circuit reliability and margins. However, in Nakajima et al, the device internal damping will vary throughout the chip and it will be virtually impossible to provide LSI circuits using that approach. Further, the need for a multitude of bias levels for control is very impractical when large scale integrated circuits are to be provided. Still further, the multi-level junctions required when fabricating the STP turning point leads to very difficult fabrication steps and processing yields will be low.

The switching device and circuits of the present invention solve these problems by using a different mechanism for soliton path selection. Rather than having path selection depend upon a delicate balance of competing forces, path selection in the present invention is controlled solely by a single bias level. That is, the direction taken by the soliton at an intersection of transmission lines depends only upon the presence or absence of a control signal of appropriate polarity. Additionally, reflections of the soliton at the intersection of the transmission lines are eliminated and unwanted solitons are destroyed at the intersection. Still further, the solution of the present invention provides isolation between input and output circuits and is therefore useful in the design of logic circuits.

Accordingly, it is primary object of the present invention to provide an improved technique for selecting the path along which a soliton will travel.

It is another object of the present invention to provide a technique for path selection of a soliton at the intersection of two or more transmission lines, where the path selection depends only upon the presence or absence of the control signal.

It is another object of the present invention to provide a path selection scheme for solitons in Josephson transmission lines wherein constant amplitude control signals are used to provide selection over the entire superconducting chip having a plurality of soliton steering devices thereon.

It is a further object of the present invention to provide a soliton deflection scheme for directing solitons to selected transmission lines wherein unwanted solitons are effectively dissipated.

It is a still further object of the present invention to provide a soliton steering device in which solitons do not experience unwanted reflections when approaching the intersection of two or more transmission lines along which the solitons could travel.

It is another object of the present invention to provide soliton steering devices for selection of paths along which solitons will travel which is easy to fabricate in a single level structure, and which has good margins for path selection.

It is another object of the present invention to provide a superconductive chip using Josephson solitons for memory and logic, wherein circuits having different functions can be fabricated from the same Josephson soliton path selection element.

DISCLOSURE OF INVENTION

The Josephson soliton selection scheme of the present invention broadly encompasses an input transmission line along which a Josephson soliton travels to the intersection point of two or more output Josephson transmission lines, means located at that intersection to dissipate the energy of a soliton trapped thereat, and a control means providing a common control signal coupled directly or inductively to both of the output transmission lines. The path selection process is one in which there are no competing forces and path selection is controlled solely by the control signal. Further, only a single bias level is required for the control signal.

In one embodiment, the input transmission line and the plurality of output transmission lines have a common first electrode in the sense that different portions of the same superconductor comprise one electrode of each of the transmission lines. A tunnel barrier is provided over this common electrode, and a second electrode is formed over the tunnel barrier. The second electrodes are interconnected via a discrete resistor (such as a normal metal). A common bias current can be injected either directly or coupled inductively to the device via one or more control lines overlying the output transmission paths. The discrete resistor at the intersection of the output transmission lines and the input transmission line eliminates reflections of the soliton from the intersection and destroys unwanted solitons. Additionally, it prevents a directly injected control signal from leaking back into the input transmission line.

Once this principle of control selection is appreciated, the design of circuits having many different functions can be achieved. A representative example is a decoder, which is described in detail.

These and other objects, features, and advantages will be apparent from the following more particular description of the preferred embodiments.

BRIEF DESCRIPTION OF THE DRAWINGS

FIGS. 1.1, 1.2, and 1.3 illustrate the nature of a soliton wave (FIG. 1.1), the circulating current $i_j(x)$ in the soliton (FIG. 1.2), and the physical representation of a soliton in a long Josephson transmission line (FIG. 1.3).

FIG. 4 is another diagram of an end view of the structure of FIG. 2, taken along the line 3—3, wherein the bias currents in the two output transmission lines are opposite in polarity. Thus, FIG. 4 illustrates how the soliton is propagated in one direction by the bias control current while the anti-soliton is trapped at the intersection.

FIGS. 5.1 and 5.2 illustrate how a resistor located at the intersection of the input transmission line and the output transmission lines can be used to dissipate the soliton or anti-soliton trapped at the intersection when the bias currents in the two output transmission lines have opposite polarity. In FIG. 5.1, a soliton is moved to the right, while in FIG. 5.2, an anti-soliton is moved to the left.

FIG. 7 is an electrical equivalent circuit of the device of FIG. 6, using point junctions to illustrate current paths in the device, while

BEST MODE FOR CARRYING OUT THE INVENTION

THEORY OF INVENTION

Figure 2:
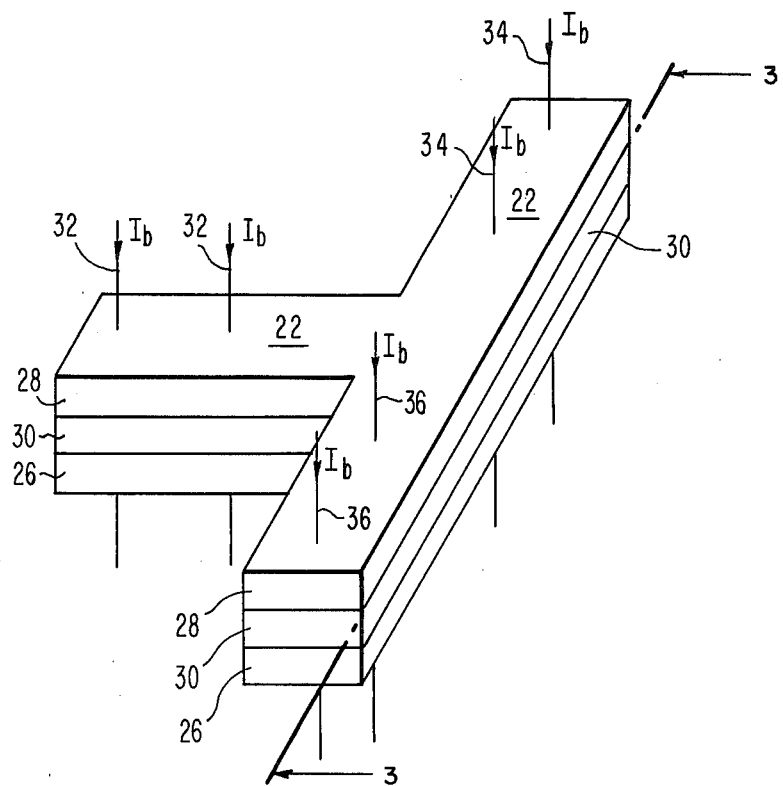
FIG. 2 is a schematic representation of an intersection of an input Josephson transmission line with two output transmission lines, while FIGS. 3.1 and 3.2 are end views of the structure of FIG. 2 taken along line 3—3, which are used to illustrate the direction of movement of a soliton and an anti-soliton at the intersection.

Isolated vortices can be created and moved in long Josephson transmission lines. These are the well known Josephson solitons which are phase waves of the type shown in FIG. 1.1. In this FIG., the phase wave 10 is propagating in the +x direction with a velocity v. A circulating current is associated with the soliton and the plot of this current $i_j(x)$ as a function of the distance x is shown in FIG. 1.2. FIG. 1.3 shows the soliton represented as a circulating current loop 12 where the direction of current in the loop is represented by the arrows, and is oppositely directed on opposite sides of the loop. Soliton 12 bridges the electrodes 14 and 16 of a Josephson device, having a tunnel barrier 18 located between the superconducting electrodes 14 and 16. As will be more apparent, the phase wave comprising soliton 12 can be moved along the transmission line comprising the elongated Josephson junction of FIG. 1.3. When this occurs, a voltage pulse proportional d$\Phi$/dt will be produced.

A rectangular Josephson junction whose dimensions are long and narrow compared to the Josephson penetration depth $\lambda_J$ (which are sometimes called one-dimensional junctions) can support Josephson solitons, the solitons being capable of being propagated along the rectangular Josephson junction.

In FIG. 1.3, the direction of the localized Josephson super current in the soliton is clockwise; however, it is possible to have a counterclockwise current. Depending upon the convention chosen, the isolated fluxoid 12 will be termed a soliton, or an anti-soliton.

A soliton can be generated in the Josephson transmission line comprising the elongated junction shown in FIG. 1.3 by either of two known techniques. One technique is to inductively couple magnetic flux into the Josephson transmission line, as for example by passing a current through a control line overlying (but insulated from) the transmission line. The current I in the control line must satisfy the condition $$\tfrac{1}{2}\Phi_0 \leq LI \leq \Phi_0 \qquad (1)$$

where L is the mutual inductance coupled to the control line and $\Phi_0$ is the magnetic flux quantum (2.07×10$^{-15}$Wb). The second technique for generating solitons in the Josephson transmission line is to directly inject a current pulse of amplitude $I_p$ at one end, such that $$I_p \leq 2\lambda_J j_1 W. \qquad (2)$$

In this expression, $\lambda_J$ is the Josephson penetration depth, $j_1$ is the Josephson current density, and W is the width of the Josephson transmission line.

The number of solitons generated by direct injection, as well as their kinetic energy, depends on the impedance and the quasi-particle tunneling inductance of the transmission line, as well as the magnitude, width, and rise and fall times of the injected pulse.

Once a soliton has been generated in a transmission line, it can be made to propagate and accelerate through the transmission line under the influence of the Lorentz force due to a bias current which tunnels from one electrode of the line to the other. In a dissipationless line, the solution can propagate with any speed v<c where c is the speed of electromagnetic waves in the junction comprising the line. In a dissipative line, this could also be achieved if the bias current is sufficiently large to compensate for the dissipation.

A moving solution or anti-solution creates a voltage pulse V related to d$\Phi$(x,t)/dt, where $\Phi$(x,t) is the position and time dependent phase difference across the two electrodes of the transmission line. When a soliton is accelerated through a biased line, the height of the associated voltage pulse increases with increasing phase velocity v and the pulse width of the voltage decreases relativistically.

In a real transmission line junction, the maximum speed of the soliton is determined by the loss and bias of the line. The bias current exerts a Lorentz force on the soliton (anti-soliton). In the steady state, the Lorentz force on the soliton due to the bias current is balanced by the drag due to the quasiparticle tunneling and surface inhomogeneities. The direction of flow of the bias current, together with the polarity of the soliton, uniquely determines the direction of motion of the soliton in the transmission line.

BEHAVIOR OF A SOLITON AT AN INTERSECTION (FIGS. 2, 3.1, 3.2)

FIG. 2 shows an input Josephson transmission line 20 which intersects with two output Josephson transmission lines 22 and 24. These transmission lines 20–24 have a common base electrode 26 and a common counter electrode 28. Although electrodes 26 and 28 are given the designation of base electrode and counter electrode, respectively, it should be understood that this is only for purposes of description. Generally, the electrode layer which is fabricated first is termed the "base" electrode, while the electrode which is formed over the tunnel barrier 30 is termed the "counter" electrode.

The presence of a bias current $I_b$ in propagation conductors 32 is used to move a soliton of appropriate polarity to the right to the intersection of output transmission lines 22 and 24. Control conductors 34 supply bias current $I_b$ in transmission line 22, while the conductors 36 supply bias current $I_b$ in transmission line 24.

FIGS. 3.1 and 3.2 are end views of the structure of FIG. 2, taken along the line 3—3. The arrows 38 input transmission line 20, or by creating a phase change of $2\pi$ at the center of the line, an anti-soliton AS is also created due to the continuity of the phase. Under the influence of the Lorentz force due to the bias current $I_b$, the soliton will drift toward one end while the anti-soliton will drift to the other end, as shown in FIG. 3.2.

In FIG. 4, a situation is shown in which each half of the transmission line is biased with a current of opposite polarity. For example, this situation would be realized in the structure of FIG. 2 if the bias current $I_b$ in transmission line 24 were oppositely directed to the bias current $I_b$ in transmission line 22. Thus, in FIG. 4 the arrows 40 are directed upwardly while the arrows 42 are directed downwardly.

The bias arrangement of FIG. 4 creates a magnetic field potential well at the center of the transmission line for the anti-soliton. When a soliton and an anti-soliton are triggered at the center of the transmission line comprising portions 22 and 24, the soliton S is steered to the right and the anti-soliton is trapped in the potential well in the center of the transmission line.

FIGS. 5.1 and 5.2 depict a situation in which a resistor R is located at the center of the transmission line and is connected between the two portions of the electrode 28. In FIG. 5.1, the bias current $I_b$ on the left hand end of the transmission line is oppositely directed from that on the right hand end, as was the situation with respect to the bias current directions in FIG. 4. Since the center of the transmission line is now resistive, the anti-soliton is dissipated after a time, while the soliton S reaches the selected output at the right hand side of this drawing. This provides a selection scheme which will be utilized in the switch of this invention.

In FIG. 5.2, the directions of the bias currents $I_b$ are reversed from their directions in FIG. 5.1. In this situation, the soliton will be trapped in the potential well in the center of the transmission line and will be dissipated, while the anti-soliton AS will be steered to the left in this drawing.

SOLITON STEERING SWITCH (FIGS. 6, 7, 8, and 9)

Figure 6:
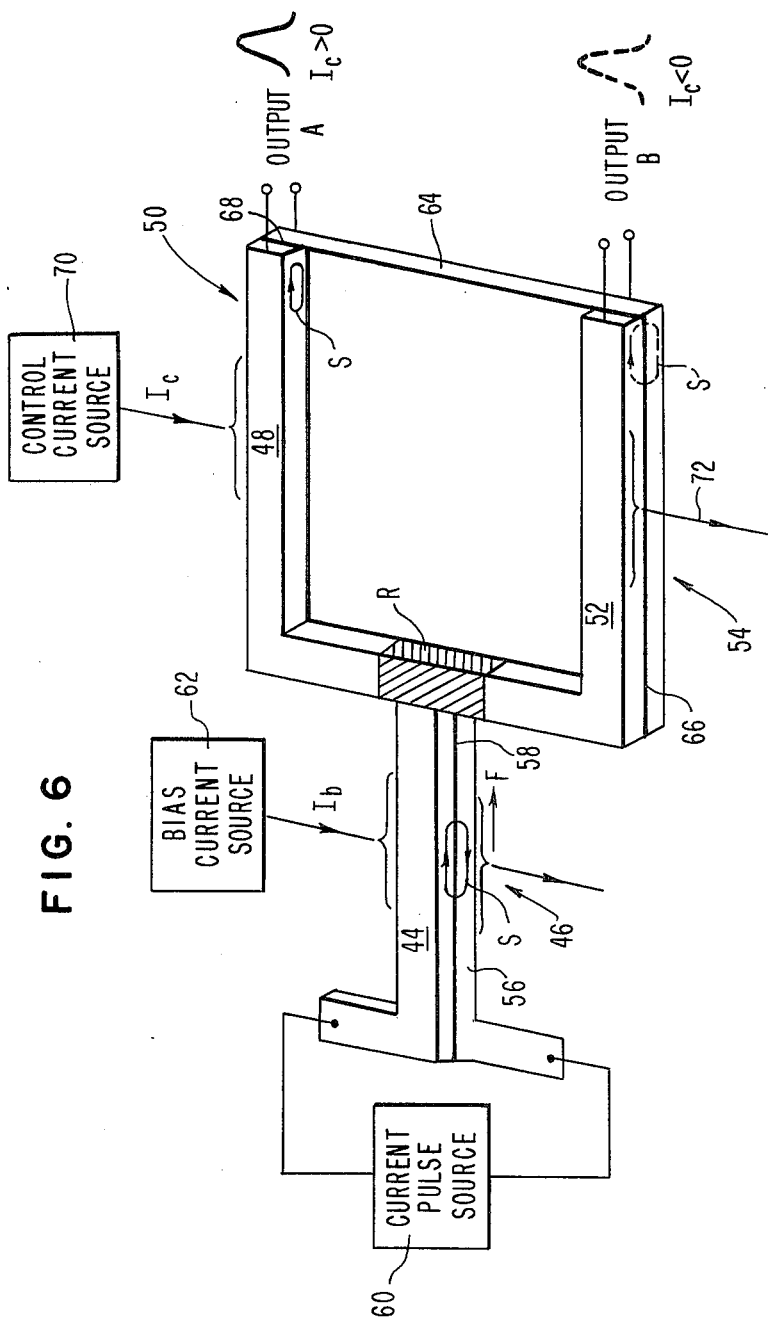
FIG. 6 shows the basic soliton device of the present invention, which can be used for unambiguous path selection in response to the presence or absence of a control signal.
Figure 7:
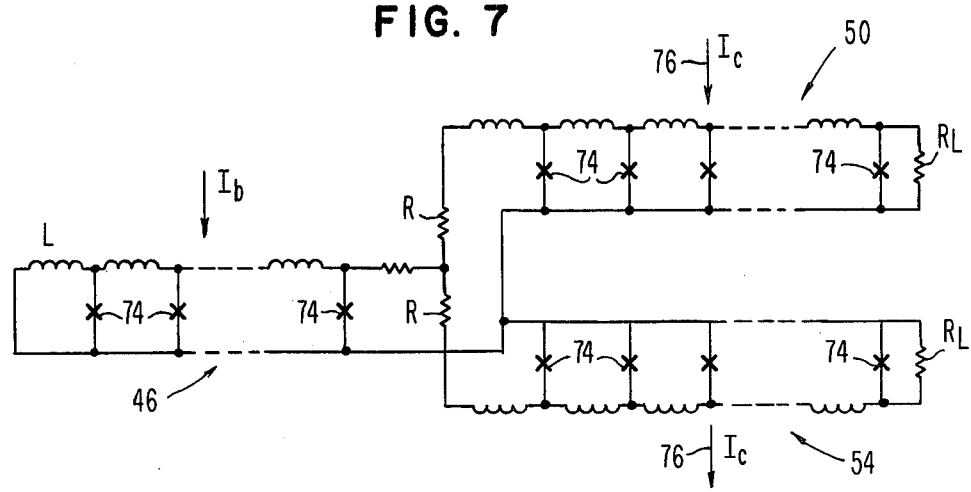

The structure and layout of a soliton switch using the selection principles described with respect to FIGS. 4, 5.1, and 5.2 is shown in FIG. 6, while the equivalent circuit for this device is shown in FIG. 7. In more detail, strip line segment 44 is the upper electrode of an input transmission line 46, while a strip line segment 48 is the upper electrode of Josephson transmission line 50. In the same manner, strip line 52 is the upper electrode of a Josephson transmission line 54. A soliton traveling from left to right along strip line 50 will provide the output A, while a soliton traveling to the right along output transmission line 54 will produce the voltage output B. Whether an output A or an output B will be produced depends upon the polarity of the control current $I_c$.

In more detail, transmission line 46 is comprised of a lower electrode 56, an upper electrode 44, and a tunnel barrier 58 located therebetween. The current pulse source 60 is connected to electrodes 44 and 56, and is used to generate a soliton S in transmission line 46. A bias current source 62 is connected across electrodes 44 and 56 and will provide a bias current $I_b$ across junction 58, in the direction indicated. The presence of this current will create a Lorentz force F on soliton S which will cause it to move toward the U-shaped configuration comprised of transmission lines 50 and 54.

Electrode 64 is common to both transmission line 50 and transmission line 54. A tunnel barrier 66 is located between the upper and lower electrodes of transmission line 54, while a tunnel barrier 68 is located between the upper and lower electrodes of transmission line 50.

The upper and lower electrodes of all of these transmission lines are superconductors and the tunnel barriers are sufficiently thin that Josephson current can tunnel therethrough. Resistor R is located in the center of the upper electrodes 48 and 52 of the output Josephson transmission lines and is electrically isolated from the common base electrode. These output transmission lines may be viewed as a single U-shaped Josephson transmission line. Resistor R can conveniently be comprised of any normal material, such as an InAu alloy in the case of Pb-In superconducting alloy electrodes. Resistor R typically is chosen to match the impedance of input transmission line 46, although it need not be precisely chosen. For example, variations from this value of 30% are acceptable. This will be apparent later when the function of the resistor R is detailed.

A control current source 70 provides a control bias current $I_c$ to electrode 48. This current tunnels through barrier 68 and then travels via electrode 64 to transmission line 54. It then tunnels through barrier 66 and leaves the device via lead 72 connected to electrode 52.

The operation of the device of FIG. 6 is consistent with the principles described with respect to FIGS. 5.1 and 5.2. The soliton S which approaches the resistor R will give rise to an anti-soliton at that location, which will be dissipated. However, the soliton will pass through the area of resistance R so quickly that it will not be dissipated. Depending upon the polarity of the control current $I_c$, it will either travel along transmission line 50 or transmission line 54. For the conventions chosen in this FIG., the soliton will provide an output A if $I_c$ is positive and will provide an output B if $I_c$ is negative. In this drawing, a soliton S is shown in transmission line 50 while a dashed line soliton S is shown in transmission line 54. Outputs A and B will be provided across the conductors shown connected to the top and bottom electrodes of the output Josephson transmission lines 50 and 54.

The widths of the Josephson lines 46, 50, and 54 are less than $\lambda_J$, so that the current $I_c$ is uniform along the width. In an optimum design, the current density is adjusted to make both $\lambda_J$ and the width equal to the minimum line width that can be fabricated. The minimum length of lines 46, 50, and 54 should be at least of the order of the wavelength of a moving soliton, and can be found from numerical simulations. In order to minimize reflections, the value of the isolation resistance R is chosen such that the resistance between electrode segment 44 and either of the other segments 48 and 52 is equal to the characteristic impedance of the transmission line.

The discrete resistor R serves many functions, but its basic function is that of dissipating the energy of the soliton (anti-soliton) which is trapped at the potential well created along the U-shaped output transmission line. Additionally, it can have an impedance such that it will eliminate reflections of the type which are detrimental to device operation, and which are described in the Nakajima et al reference. Furthermore, the presence of resistor R ensures that the control current $I_c$ will tunnel from the top electrode to the bottom electrode in transmission line 50, rather than following a path along the top electrode 48 to the top electrode 52 of transmission line 54. In the embodiment of FIG. 6, the control current in transmission line 50 tunnels downward while the same current tunnels upward in transmission line 54. Because resistor R prevents the control current $I_c$ from traveling back into input transmission line 46, it also provides isolation between the input stage and the U-shaped output stage of the device.

FIG. 7 is an equivalent electrical circuit of the device of FIG. 6. This equivalent circuit uses standard representations, and for this reason the transmission lines 46, 50, and 54 are represented by the inductors L and the point junctions 74. The bias current $I_b$ which flows across the tunnel junction in transmission line 46 flows along current paths represented by the point junctions 74. Resistor R of FIG. 6 is represented by the resistances R located between input line 46 and output transmission lines 50 and 54. Transmission lines 50 and 54 are terminated in load resistances $R_L$. The control currents $I_c$ flowing in the output transmission lines are indicated by the arrows 76.

Figure 8:
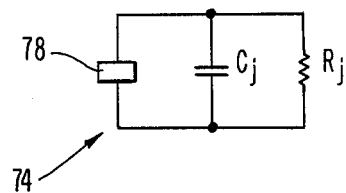
FIG. 8 is an electrical equivalent circuit of a point junction.

FIG. 8 shows the well known resistively and capacitively shunted junction model which is used to represent the point junctions 74 of FIG. 7. In this model, an ideal Josephson element 78 is in parallel with the capacitor $C_j$ and a non-linear resistor $R_j$. $R_j$ is the inverse of the quasi-particle tunneling conductance.

Figure 9:
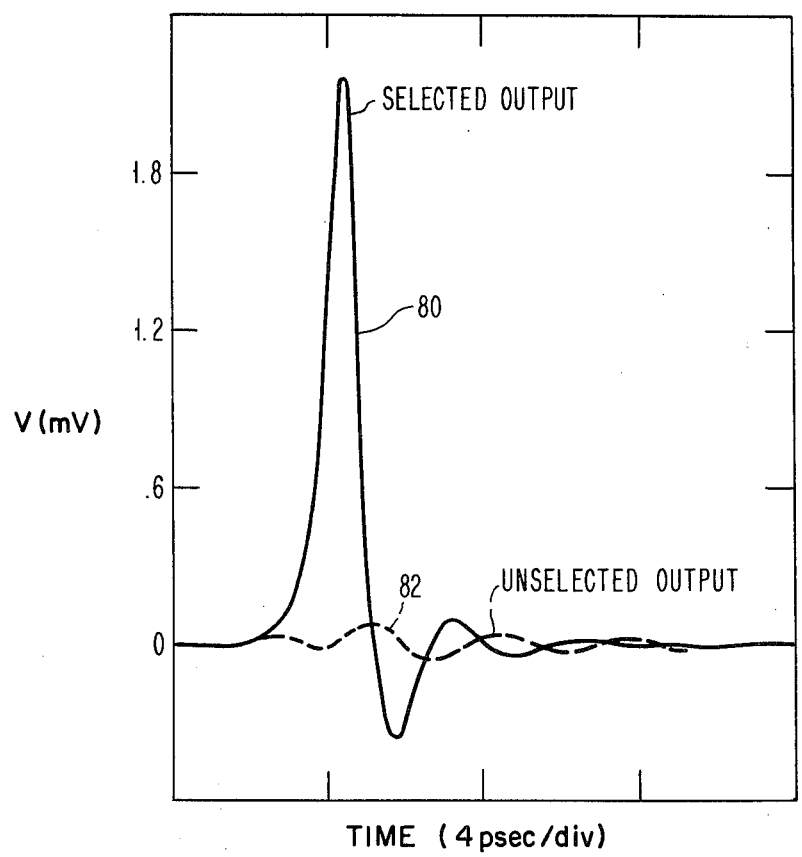
FIG. 9 is a plot of a simulated voltage waveform at the selected output (solid line) of the device of FIG. 6, as compared with that at the unselected output path (dashed line).

FIG. 9 shows a numerically calculated voltage waveform at the selected output as compared with that at the unselected output. In FIG. 9, the output voltage is plotted against time, and the selected output is represented by the solid curve 80, while the unselected output is represented by the dashed curve 82. The small voltage disturbance reaching the unselected output is due to plasma oscillations and has a peak amplitude factor of 25 smaller than the selected one. Thus, the discrimination between the selected and the unselected outputs can be made very large.

In the simulation used to develop the curves of FIG. 9, Josephson transmission lines comprised of lead alloy tunnel junctions with line widths of 2.5 microns were used, where the Josephson current densities $j_1$ were 600 A/cm$^2$. The quasi-particle tunneling characteristic was chosen to be typical of that obtained with high quality junctions. The control current density used was 0.7 $j_1Wl$, where W and l are, respectively, the width and length of the Josephson transmission line segments. In this simulation, 24 point junction sections were used for each Josephson transmission line segment, where each segment was approximately $3\lambda_J$ long.

Figure 10:
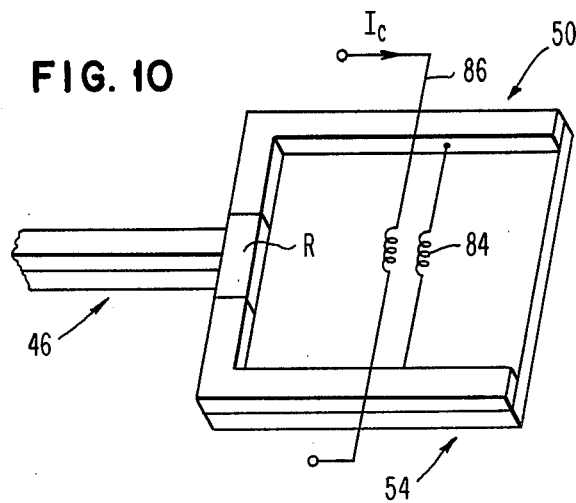
FIG. 10 is the basic soliton steering device of FIG. 6, except that the control currents $I_c$ are magnetically coupled to the device, rather than being directly injected into the device.

In FIG. 6, the control current $I_c$ was directly coupled to the device. However, the control current $I_c$ can be magnetically coupled to the device. This is shown in FIG. 10, where the numerical designations of FIG. 6 are used wherever possible. Thus, the input transmission line 46 is connected to a U-shaped output transmission line comprising transmission line 50 and transmission line 54. The basic structure of FIG. 10 is the same as that of FIG. 6, except that the control current $I_c$ is now magnetically coupled to the device, rather than being directly injected into top electrode 48 of transmission line 50.

Magnetic coupling of the control current provides isolation of the device from the control line. It is achieved by connecting an inductor 84 between the top electrodes of lines 50 and 54, and placing a control line 86 over it. Control line 86 is insulated from the top electrodes of the transmission lines 46, 50, and 54.

In operation, a current $I_c$ through the control line induces a screening current in the device. If the screening current flows from the top electrode to the bottom electrode in transmission line 50, it will flow from the bottom electrode to the top electrode in transmission line 54. To avoid trapping a flux quantum, the design should satisfy $LI_0 < \Phi_0$, where L is the mutual inductance between the control line 86 and the inductor 84, and $I_0$ is the maximum Josephson current of a segment of the equivalent circuit. If $LI_0 > \Phi_0$, resetting would be required.

Figure 11:
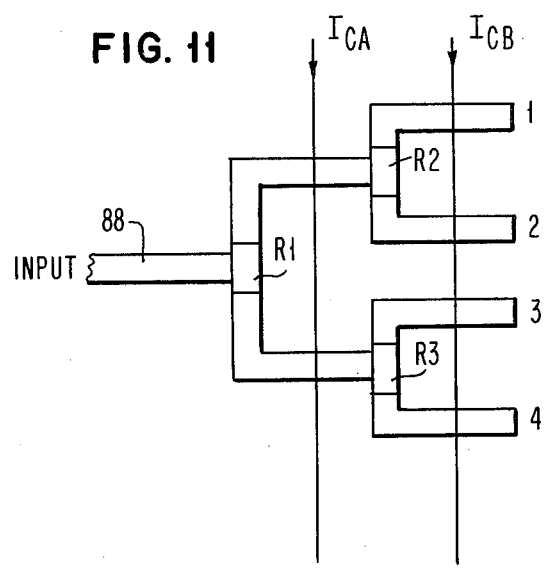
FIG. 11 is a schematic diagram of a two-bit decoder using the principles of this invention and the device of FIG. 6.
Figure 12:
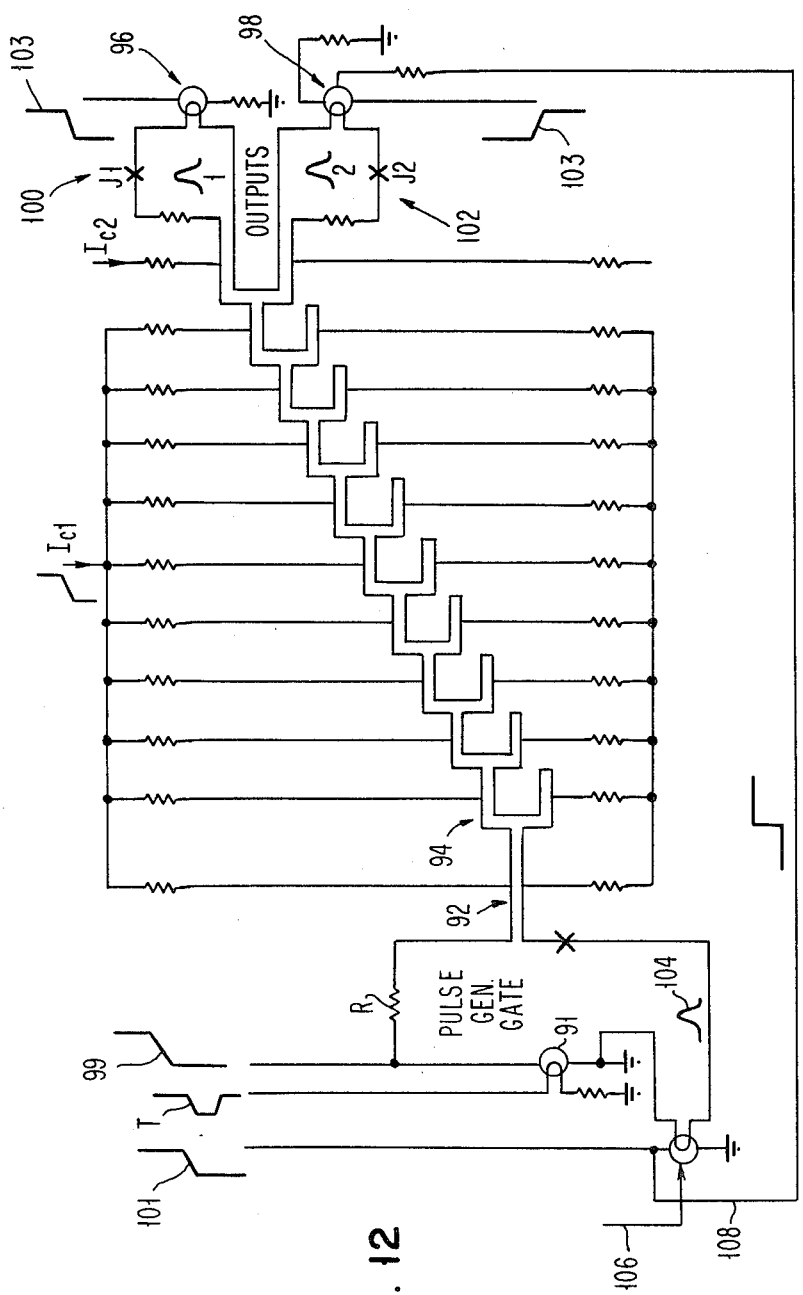
FIG. 12 is a schematic diagram of a ten-stage chain of soliton steering devices which can be used to form a decoder circuit.

DEVICE APPLICATION (FIGS. 11 and 12)

One of the simplest circuits that can be formed with this soliton steering device is a decoder. A two-stage tree decoder is shown schematically in the top view represented by FIG. 11. This decoder has three current steering sections at the intersections of which are located the resistors R1, R2, and R3. Depending upon the application of control currents $I_{CA}$ and $I_{CB}$, a soliton provided to the input of Josephson transmission line 88 will appear at a selected output 1, 2, 3, or 4. An appropriate combination of the polarities of these control currents determines the output to which the soliton is delivered. For example, if $I_{CA}$ and $I_{CB}$ are positive, then output 1 is selected. If $I_{CA}$ is positive and $I_{CB}$ is negative, then output 2 will be selected. If $I_{CA}$ is negative and $I_{CB}$ is positive, output 3 will be selected. If control $I_{CA}$ is negative and control $I_{CB}$ is negative, output 4 will be selected.

The lines carrying address currents $I_{CA}$ and $I_{CB}$ can also function as address registers. In such a case, after address currents are established, decoding commences when a soliton is triggered at the input. The decoding delay is the time needed to steer a soliton from the input to the selected output. The operation of the decoder is unaffected, even if more than one soliton is generated at the input.

In the decoder of FIG. 11, the control currents are bipolar, however, by running two independent control lines (instead of one) over each steering device, unipolar currents could be used by employing a true and complement arrangement, as would be appreciated of those of skill in the art. For example, reference is made to S. M. Faris et al, IBM J. Res. Development 24, 143 (1980).

To verify the concept of the basic soliton current steering device of this invention, a circuit including a chain of 10 soliton steering devices was designed and tested. This circuit is indicated schematically in FIG. 12 and an be used to test the concept of a ten-stage decoder. Each stage of the decoder has the equivalent circuit of FIG. 7. In this experiment, the controls for the first nine stages are interconnected to a common supply current $I_{C1}$. The last stage has an independent control current $I_{C2}$. The pulse generator 90 at the input of the device chain includes pulse generator gate 91 and resistor R. It generates a soliton, which is accelerated through a Josephson transmission line 92 to the first stage 94. By means of the control (address) currents $I_{C1}$ and $I_{C2}$, the soliton can be steered to output 1 or output 2. The output to which the soliton is steered is determined by monitoring the voltage of the interferometer monitor gates 96 and 98 which are controlled by the output loops 100 and 102. The waveform of the current pulse associated with the soliton is sampled by a high resolution Josephson sampling scheme incorporating monitor gate 98. This sampling scheme is described by S. M. Faris in Appl. Phys. Lett. 36, 1005 (1980).

Output loops 100 and 102 contain Josephson junctions J1 and J2, respectively, which sharpen the pulses delivered to the monitor gates 96 and 98. The unselected branches of chain stages 1–9 are terminated with matching resistors (not shown in this FIG.). The circuit was designed with a five micron minimum line width technology rather than a smaller line technology, in order to increase the decoding delay for experimental convenience.

The functional operation of the chain of devices has been verified quasi-statically for all possible permutations of the inputs. The experimental Josephson current density was 250 A/cm$^2$. The tests performed are summarized in Table I with X indicating which monitor gate was switched. For example, monitor gate 96 is observed to switch only when both controls $I_{C1}$ and $I_{C2}$ are positive and a soliton is generated (device chain triggered). The range through which $I_{C1}$ and $I_{C2}$ could vary while observing the operation noted in Table I was measured to be ±43% for $I_{C1}$ and ±67% for $I_{C2}$. The range for $I_{C1}$ is lower than that for $I_{C2}$ because of device-to-device variation in current density. The theoretical maximum tolerance value for the range of $I_{C1}$ and $I_{C2}$ for this design is ±75%.

The pulse generator trigger T initiates a pulse 104 in the generator circuit 90. Current level 99 is the gate current for pulse generator gate 91, while current level 101 is the gate current for gate 106. Currents 103 are the gate currents for monitor gates 96 and 98.

TABLE I

| Decoder Triggered | Control Polarity | | Output Monitor Switched | | |
|---|---|---|---|---|---|
| | $I_{C1}$ | $I_{C2}$ | Output 1 | Output 2 | None |
| Yes | + | + | X | | |
| No | + | + | | | X |
| Yes | − | − | | X | |
| No | − | − | | | X |
| Yes | − | + | | | X |
| Yes | + | − | | | X |

The device delay was measured in the following manner. The current pulse 104 which triggers an input soliton also switches an interferometer 106, that functions as a delay reference gate. This gate transfers current into a reference signal line 108. This reference line is monitored by the Josephson sampler comprising monitor gate 98. After a time equal to the transit time of the soliton through the input Josephson transmission line 92 to the first stage 94, plus the total device delay, the soliton reaches the selected output. The current pulse associated with the soliton at the selected output is also monitored by the sampler comprising gate 98. From the relative separation of the two sampled waveforms, making small corrections for the trigger pulse rise time and the reference line delay, the total device delay can be extracted.

The soliton steering device of this invention can be used to provide logic circuits as was done in the aforementioned Nakajima reference. This current steering device is the fastest and smallest such device known to date and will lead to many improved circuit performances. Although specific embodiments have been shown, it will be apparent to those of skill in the art that other such embodiments can be designed. For example, multiple control lines can be used in combination where the currents in the lines add to produce the control effect, or produce opposite effects thereby effectively canceling each other. In this manner complex logic functions can be designed.

Having thus described my invention, what I claim as new, and desire to secure by Letters Patent is:

1. A device for steering Josephson solitons, comprising in combination:
    an input Josephson transmission line capable of supporting a Josephson soliton therein,
    at least two output Josephson transmission lines which intersect said input line at a common intersection, said output transmission lines being capable of supporting Josephson solitons therein,
    means for introducing a Josephson soliton to said intersection,
    control means for selecting one of said output transmission lines into which a soliton from said intersection will move, there being no soliton in the nonselected output transmission line, said control means including:
    trapping means located at said intersection for trapping an antisoliton at said intersection,
    means located at said intersection for dissipating said antisoliton trapped at said intersection said soliton passing through said trapping means, and
    current means for providing simultaneous electrical control currents of opposite polarities coupled to said output transmission lines to attract said soliton into said selected output transmission line and for simultaneously repelling said soliton from said nonselected output transmission line, wherein a single current path is used for the control currents in both of said output transmission lines, the same current flowing in opposite directions in said output transmission lines.

2. The device of claim 1, where said currents in said output lines have the same amplitude.

3. The device of claim 1, where said means for dissipating is a resistor located between said input transmission line and said output transmission lines.

4. The device of claim 3, where said resistor has a resistance such that the resistance between the input transmission line and either of the output transmission lines is equal to the characteristic impedance of said input transmission line.

5. The device of claim 1, where said currents are directly injected into said output transmission lines.

6. The device of claim 1, where said currents are magnetically coupled to said output transmission lines.

7. The device of claim 1, where said input transmission line and said output transmission lines are comprised of two electrodes separated by a tunneling barrier, said input transmission line and said output transmission lines sharing a common electrode.

8. The device of claim 7, where said means for dissipating is located in one electrode of said transmission lines.

9. The device of claim 1, further including another of said soliton steering devices connected to said input transmission line.

10. A device for steering Josephson solitons, comprising in combination:
    an input Josephson transmission line capable of supporting a Josephson soliton therein,
    at least two output Josephson transmission lines which intersect said input line at a common intersection, said output transmission lines being capable of supporting Josephson solitons therein,
    means for introducing a Josephson soliton to said intersection,
    control means for selecting one of said output transmission lines into which a soliton from said intersection will move, there being no soliton in the nonselected output transmission line, said control means including
    trapping means located at said intersection for trapping an antisoliton at said intersection,
    means located at said intersection for dissipating said antisoliton trapped at said intersection, said soliton passing through said trapping means,
    an inductor electrically connected between said output transmission lines, and
    a current carrying control conductor overlying both of said output transmission lines, current in said control conductor producing a magnetic field coupled to said device for producing screening currents of opposite polarity in said output transmission lines, the screening current in said selected output line attracting said soliton and the screening current of opposite polarity in the nonselected output line repelling said soliton.

11. The device of claim 10, where said means for dissipating is a resistor located between said input transmission line and said output transmission lines.

12. The device of claim 11, where said resistor has a resistance such that the resistance between the input transmission line and either of the output transmission lines is equal to the characteristic impedance of said input transmission line.

13. The device of claim 11, where said input transmission line and said output transmission lines are comprised of two electrode layers separated by a tunneling barrier, said input transmission line and said output transmission lines sharing a common electrode layer.

14. The device of claim 13, where said means for dissipating is located in one electrode layer of said transmission lines, said inductor being connected between portions of said one electrode layer, said portions being in different output transmission lines.

15. The device of claim 10, further including another of said soliton steering devices connected to said input transmission line.

* * * * *